(12) United States Patent
Kishioka et al.

(10) Patent No.: US 7,947,424 B2
(45) Date of Patent: May 24, 2011

(54) COMPOSITION FOR FORMING ANTI-REFLECTIVE COAT

(75) Inventors: Takahiro Kishioka, Nei-gun (JP);
Shinya Arase, Funabashi (JP); Ken-ichi Mizusawa, Chiyoda-ku (JP); Keisuke Nakayama, Nei-gun (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/520,461

(22) PCT Filed: Jul. 11, 2003

(86) PCT No.: PCT/JP03/08832
§ 371 (c)(1),
(2), (4) Date: Jan. 7, 2005

(87) PCT Pub. No.: WO2004/008253
PCT Pub. Date: Jan. 22, 2004

(65) Prior Publication Data
US 2005/0175927 A1 Aug. 11, 2005

(30) Foreign Application Priority Data

Jul. 17, 2002 (JP) .................................. 2002-208045
Oct. 17, 2002 (JP) .................................. 2002-302535

(51) Int. Cl.
*G03F 7/00* (2006.01)
*G03F 7/004* (2006.01)
*G03F 7/26* (2006.01)

(52) U.S. Cl. .................. 430/273.1; 430/270.1; 430/311; 430/313; 430/314; 430/950

(58) Field of Classification Search ............... 430/270.1, 430/311, 273.1, 313, 314, 950
See application file for complete search history.

(56) References Cited

U.S. PATENT DOCUMENTS

| | | | |
|---|---|---|---|
| 2,414,211 A | | 1/1947 | Rosin et al. |
| 4,731,273 A | * | 3/1988 | Bonk et al. ....................... 428/57 |
| 4,751,269 A | * | 6/1988 | Bonk et al. ..................... 525/163 |
| 5,576,405 A | * | 11/1996 | Kawashima et al. ...... 526/318.4 |
| 5,693,691 A | | 12/1997 | Flaim et al. |
| 5,707,776 A | * | 1/1998 | Kawabe et al. ............ 430/270.1 |
| 5,851,730 A | * | 12/1998 | Thackeray et al. ......... 430/271.1 |
| 5,919,599 A | | 7/1999 | Meador et al. |
| 6,083,665 A | | 7/2000 | Sato et al. |
| 6,090,531 A | | 7/2000 | Mizutani et al. |
| 6,284,428 B1 | | 9/2001 | Hirosaki et al. |
| 6,348,553 B1 | * | 2/2002 | Ogita et al. .................... 526/261 |
| 6,468,718 B1 | * | 10/2002 | Kang et al. ................. 430/281.1 |
| 6,544,717 B2 | | 4/2003 | Hirosaki et al. |
| 6,689,535 B2 | * | 2/2004 | Iguchi et al. ............... 430/270.1 |
| 6,737,492 B2 | * | 5/2004 | Kang et al. ..................... 526/316 |
| 2001/0049072 A1 | | 12/2001 | Hirosaki et al. |
| 2002/0055064 A1 | | 5/2002 | Iguchi et al. |
| 2002/0192590 A1 | | 12/2002 | Mase et al. |
| 2003/0198894 A1 | * | 10/2003 | Mizutani et al. ........... 430/280.1 |

FOREIGN PATENT DOCUMENTS

| | | |
|---|---|---|
| CN | 1278798 A | 1/2001 |
| EP | 0566093 A1 | 10/1992 |
| EP | 1035 442 A2 | 9/2000 |
| JP | A 10-333336 | 12/1998 |
| JP | A 11-84673 | 3/1999 |
| JP | A 2000-010293 | 1/2000 |
| JP | A 2000-221690 | 8/2000 |
| JP | A 2000-284491 | 10/2000 |
| JP | A 2001-5186 | 1/2001 |
| JP | A 2000-221689 | 8/2001 |
| JP | A 2002-148791 | 5/2002 |
| WO | WO-A-01/83234 | 11/2001 |
| WO | WO 02/69046 A1 | 2/2002 |

OTHER PUBLICATIONS

Lynch et al., "Properties and Performance of Near UV Reflectivity Control Layers," *Proceedings of SPIE*, vol. 2195, pp. 225-229 (1994).

Taylor et al., "Methacrylate Resists and Antireflective Coatings for 193 nm Lithography," *Proceedings of SPIE*, vol. 3678, pp. 174-185 (Mar. 1999).

Meador et al., "Recent Progress in 193 nm Antireflective Coatings," *Proceedings of SPIE*, vol. 3678, pp. 800-809 (Mar. 1999).

* cited by examiner

*Primary Examiner* — Amanda C. Walke
(74) *Attorney, Agent, or Firm* — Oliff & Berridge, PLC

(57) ABSTRACT

There is provided a composition for forming anti-reflective coating containing a urea compound substituted by hydroxyalkyl group or alkoxyalkyl group, and preferably a light absorbing compound and/or a light absorbing resin; a method of forming a anti-reflective coating for a semiconductor device by use of the composition; and a process for manufacturing a semiconductor device by use of the composition. The composition according to the present invention exhibits a good light-absorption to a light having a wavelength used for manufacturing a semiconductor device. Therefore, the composition exerts a high protection effect against light reflection, and has a high dry etching rate compared with photoresist layers.

8 Claims, No Drawings

COMPOSITION FOR FORMING ANTI-REFLECTIVE COAT

TECHNICAL FIELD

The present invention relates to a composition for forming anti-reflective coating available for reducing an adverse effect due to a reflection of irradiation light for exposing a photoresist applied on a substrate from the substrate, a method of forming an anti-reflective coating by use of the composition, and a process for manufacturing a semiconductor device by use of the composition.

BACKGROUND ART

Conventionally, in the manufacture of semiconductor devices, micro-processing by lithography using a photoresist composition has been carried out. The micro-processing is a processing method including forming a thin film of a photoresist composition on a substrate to be processed, such as silicon wafer, irradiating actinic rays such as ultraviolet rays through a mask pattern on which a pattern for a semiconductor device is depicted, developing it to obtain a resist pattern, and etching the substrate to be processed, such as silicon wafer using the resist pattern as a protective film. However, in recent progress in high integration of semiconductor devices, there has been a tendency that shorter wavelength actinic rays are being used, i.e., ArF excimer laser beam (wavelength 193 nm) and further $F_2$ excimer laser (wavelength 157 nm) have been taking the place of KrF excimer laser beam (wavelength 248 nm). Along with this change, influences of random reflection and standing wave off a substrate have become serious problems. Accordingly, it has been widely studied to provide an anti-reflective coating between the photoresist and the substrate to be processed (Bottom Anti-Reflective Coating, BARC).

As the anti-reflective coating, inorganic anti-reflective coatings made of titanium, titanium dioxide, titanium nitride, chromium oxide, carbon or α-silicon, etc. and organic anti-reflective coatings made of a light-absorbing substance and a polymer compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating materials include high absorbance to light and radioactive rays, no intermixing with the photoresist layer (being insoluble in photoresist solvents), no diffusion of low molecular substances from the anti-reflective coating material into the topcoat resist upon coating or heat-drying, and a higher dry etching rate than the photoresist (see, for example, Tom Lynch et al., "Properties and Performance of Near UV Reflectivity Control Layers", US, in Advances in Resist Technology and Processing XI, Omkaram Nalamasued., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conleyed., Proceedings of SPIE, 1999, Vol. 3678, p.174-185; and Jim D. Meador et al., "Recent Progress in 193 nm Antireflective Coatings, US, in Microlithography 1999: in Advances in Resist Technology and Processing XVI, Will Conleyed., Proceedings of SPIE, 1999, Vol. 3678, p. 800-809).

In addition, is known a material for undercoat in lithography comprising a nitrogen-containing compound with an amino group substituted with a hydroxyalkyl group or an alkoxyalkyl group (see, for example Japanese Patent Laid-open Nos. 2000-221689 and 2000-284491).

DISCLOSURE OF INVENTION

The present invention was made so as to solve the above-mentioned problems in the prior art.

A first object of the present invention is to provide a composition for forming anti-reflective coating used for lithography process for manufacturing a semiconductor device.

A second object of the present invention is to provide a method of forming an anti-reflective coating for lithography which effectively absorbs reflection light from a substrate in case where irradiation light with a wavelength of 248 nm, 193 nm, 157 nm or the like is used for micro-processing, which causes no intermixing with photoresist layers, which affords an excellent photoresist pattern, and which has a high dry etching rate compared with photoresist layers.

A third object of the present invention is to provide a method for manufacturing a semiconductor device, by which a photoresist pattern is formed by use of the above-mentioned composition for forming anti-reflective coating.

The invention according to the present claim 1 is a composition for forming anti-reflective coating characterized by containing a compound of formula (1)

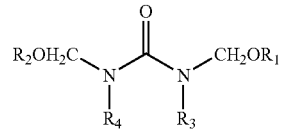

Formula (1)

wherein $R_1$ and $R_2$ are independently of each other hydrogen atom or an alkyl group, $R_3$ and $R_4$ are independently of each other hydrogen atom, methyl group, ethyl group, hydroxymethyl group or an alkoxymethyl group.

The invention according to the present claim 2 is a composition for forming anti-reflective coating characterized by containing a resin produced from the compound of formula (1) according to the present claim 1.

The invention according to the present claim 3 is the composition for forming anti-reflective coating according claim 2, wherein the resin is a condensation product produced from the compound of formula (1).

The invention according to the present claim 4 is the composition for forming anti-reflective coating according to any one of claims 1 to 3, further containing a light absorbing compound and/or a light absorbing resin.

The invention according to the present claim 5 is the composition for forming anti-reflective coating according to claim 4, wherein the light absorbing compound is at least one compound selected from naphthalene compounds and anthracene compounds.

The invention according to the present claim 6 is the composition for forming anti-reflective coating according to claim 4, wherein the light absorbing compound is at least one compound selected from triazine compounds and triazine trione compounds.

The invention according to the present claim 7 is the composition for forming anti-reflective coating according to claim 4, wherein the light absorbing resin is a resin having in the structure at least one aromatic ring structure selected from benzene ring, naphthalene ring and anthracene ring.

The invention according to the present claim 8 is the composition for forming anti-reflective coating according to any one of claims 1 to 3, further containing a resin having at lease one crosslink-forming substituent selected from hydroxy group, carboxy group, amino group and thiol group.

The invention according to the present claim 9 is the composition for forming anti-reflective coating according to any one of claims 1 to 3, further containing an acid and/or acid generator.

The invention according to the present claim 10 is a method of forming an anti-reflective coating for use in a manufacture of a semiconductor device, characterized by comprising the steps of: coating the composition for forming anti-reflective coating according to any one of claims 1 to 3 on a substrate, and baking it.

The invention according to the present claim 11 is a process for manufacturing a semiconductor device, characterized by comprising the steps of:

coating the composition for forming anti-reflective coating according to any one of claims 1 to 3 on a substrate and baking it to form an anti-reflective coating;

forming a photoresist on the anti-reflective coating;

exposing the substrate covered with the anti-reflective coating and the photoresist with a light;

developing it;

transferring an image on the substrate by etching to form an integrated circuit device.

BEST MODE FOR CARRYING OUT THE INVENTION

The composition for forming anti-reflective coating according to the present invention is basically a composition comprising a compound of formula (1) and a solvent, or a composition comprising a resin produced from a compound of formula (1) and a solvent, the composition can contain as arbitrary component a surfactant and the like. The composition for forming anti-reflective coating according to the present invention contains preferably 0.1 to 50 mass %, more preferably 0.5 to 30 mass % of solid content. In this specification, the solid content means components other than solvent components in the composition for forming anti-reflective coating.

In the composition for forming anti-reflective coating according to the present invention, the compounds of formula (1) are used as an active ingredient. In formula (1), $R_1$ and $R_2$ are independently of each other hydrogen atom or an alkyl group, $R_3$ and $R_4$ are independently of each other hydrogen atom, methyl group, ethyl group, hydroxymethyl group or an alkoxymethyl group.

The alkyl group includes for example methyl group, ethyl group, isopropyl group, n-butyl group, n-hexyl group or the like. In addition, the alkoxymethyl group includes for example methoxymethyl group, ethoxymethyl group, butoxymethyl group or the like.

In the present invention, the compound of formula (1) may be used alone or a mixture of two or more the compounds of formula (1). The composition for forming anti-reflective coating contains the compound of formula (1) in an amount of preferably 10 mass % or more, more preferably 50 to 99 mass %, and most preferably 60 to 95 mass % based on 100 mass % of the total solid content.

The compound of formula (1) can be obtained by subjecting urea or methylurea, etc. to methylolation by reaction of it with formalin in boiling water. In this reaction, a basic catalyst such as sodium hydroxide, potassium hydroxide, tetramethylammonium hydroxide or the like can be used. Further, the compound of formula (1) can be also obtained by subjecting the compound obtained by methylolation of urea or methylurea, etc. to alkoxyalkylation by reaction of it with alcohol such as methanol, ethanol, isopropanol, n-hexanol or the like. In this reaction, an acid catalyst such as hydrochloric acid, sulfuric acid, methanesulfonic acid or the like can be used.

In the composition for forming anti-reflective coating according to the present invention, resins produced from the compounds of formula (1) can be also used. The resins include resins produced by a condensation reaction of the compound of formula (1) with a compound that can be condensed with the compound of formula (1), and resins being condensation products produced by condensation reaction between the compounds of formula (1). These resins have preferably a weight average molecular weight of 100 to 1,000,000, more preferably 200 to 500,000.

In the present invention, the resin produced from the compound of formula (1) can be used alone or in a mixture of two or more. The composition for forming anti-reflective coating according to the present invention contains the resin produced from the compound of formula (1) in an amount of preferably 10 mass % or more, more preferably 50 to 99 mass %, and most preferably 60 to 95 mass % based on 100 mass % of the total solid content.

These resins can be obtained by subjecting to condensation reaction between the compounds of formula (1) or by mixing the compound of formula (1) with a compound that can be condensed with the compound of formula (1), and subjecting the mixture to condensation reaction by heating. The condensation reaction is preferably carried out in the state of solution obtained by dissolving the compounds of formula (1) or the compound of formula (1) and a compound that can be condensed with the compound of formula (1) in an organic solvent such as benzene, toluene, xylene, ethyl lactate, butyl lactate, propylene glycol monomethyl ether, propylene glycol monomethyl ether acetate, N-methyl pyrrolidone or the like. In addition, an inorganic acid such as hydrochloric acid, sulfuric acid, phosphoric acid or the like, an organic acid such as formic acid, acetic acid, methane sulfonic acid, toluene sulfonic acid or the like can be used as a catalyst for the condensation reaction. The reaction temperature or reaction time of the condensation reaction depends on compounds to be used, the degree of polymerization or the molecular weight of the aimed resin, or the like, and the reaction time may be selected from the region from 0.1 hour to 100 hours, and the reaction temperature may be selected from the region from 20° C. to 200° C. In case where an acid catalyst is used, it can be used in an amount of 0.001 to 50 mass % based on the total mass of the used compounds.

In the resins produced from the compound of formula (1) and a compound that can be condensed with the compound of formula (1), the proportion of the compound of formula (1) and a compound that can be condensed with the compound of formula (1) is not specifically limited, and the compound of formula (1) is contained in an amount of preferably 30 mass % or more, more preferably 50 mass %, most preferably 70 mass % based on the total mass of the compound of formula (1) and a compound that can be condensed with the compound of formula (1) in consideration of a protection effect against light reflection, attenuation coefficient, etching rate, or the like of the anti-reflective coating prepared by using the resins.

As the compound that can be condensed with the compound of formula (1), a compound having a substituent that can be condensed with the compound of formula (1), such as hydroxy group, carboxyl group, amino group, alkoxymethyl group or the like can be used. The compound includes for example a compound having hydroxy group, such as ethylene glycol, propylene glycol, arabitol, cyclohexane diol, poly(2-hydroxyethyl) methacrylate, phenol novolak, tris(2-hydroxyethyl) triazine trione, naphthol, benzyl alcohol, 9-hydroxymethylanthracene or the like; a compound having carboxyl group, such as maleic acid, phthalic acid, malonic acid, benzoic acid, naphthalene carboxylic acid, 9-anthracene carboxylic acid or the like; a compound having amino group, such as ethylenediamine, amino anthracene, aniline, hexamethylenediamine or the like; a compound having alkoxymethyl group, such as glycoluril compound manufactured by Mitsui Cytec Co., Ltd. (trade name: Powderlink 1174, Cymel 1170), methoxymethyl type melamine crosslinking agent compound (trade name: Cymel 300, Cymel 301, Cymel 303, Cymel 350), butoxymethyl type melamine crosslinking agent compound (trade name: Mycoat 505, Mycoat 508) or the like.

The compound of formula (1) and the resin produced therefrom include also commercially available products such as methylated urea resin manufactured by Mitsui Cytec Co., Ltd. (trade name: UFR65), butylated urea resin (trade name: UFR300, U-VAN10S60, U-VAN10R, U-VAN11HV), butylated urea melamine resin (U-VAN132, U-VAN135, U-VAN136, U-VAN55); urea/formaldehyde resin manufactured by Dainippon Ink and Chemicals Inc. (high condensed type, trade name: Bekkamin J-300S, Bekkamin P-955, Bekkamin N) or the like.

It is assumed that resins that can be produced from the compound of formula (1) have the following structure.

That is, in the resins produced by condensation between the compounds of formula (1), for example the resins produced by condensation between tetrabutoxy methyl ureas being the compounds of formula (1), it is assumed that the condensation occurs at the butoxymethyl moiety and that the resulting resin has the structure of formula (2) in which the urea moieties are linked through —$CH_2$— or —$CH_2OCH_2$—. In the meanwhile, it is assumed that in the production of the resin, all butoxymethyl groups in tetrabutoxy methyl urea are not involved in the production of the resin but a part of butoxymethyl groups remain intact.

Formula (2)

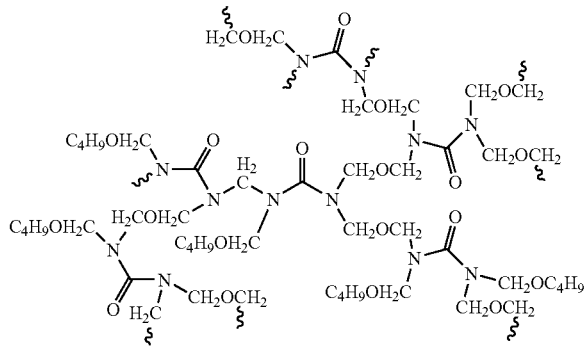

In the resin produced from the compound of formula (1) and a compound that can be condensed with the compound of formula (1), for example the resin produced by condensation of tetrabutoxy methyl urea being a compound of formula (1) with hexamethoxymethylmelamine being a compound that can be condensed with the compound of formula (1), it is assumed that the condensation occurs at the butoxymethyl moiety or methoxymethyl moiety and that the resulting resin has the structure of formula (3) in which the urea moiety and the melamine moiety are linked through —$CH_2$— or —$CH_2OCH_2$—. In the meanwhile, it is assumed that in the production of the resin, all butoxymethyl groups and methoxymethyl groups in tetrabutoxy methyl urea and hexamethoxy methyl melamine are not involved in the production of the resin but a part of butoxymethyl groups or methoxymethyl groups remain intact.

Formula (3)

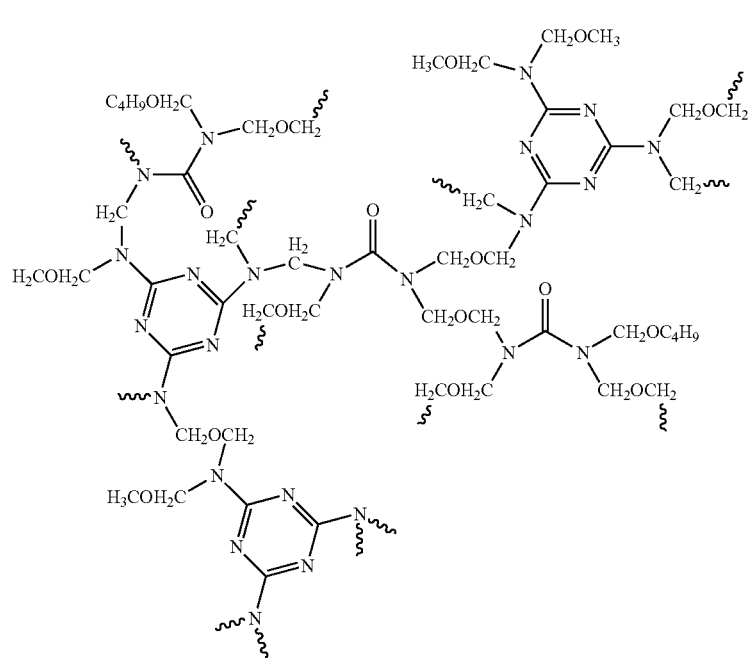

In addition, when for example a compound having two hydroxy groups is used as the compound that can be condensed with the compound of formula (1), in the resin produced by the condensation between the compound with tetrabutoxymethylurea, it is assumed that the condensation occurs between the hydroxy moiety and the butoxymethyl moiety and that the resulting resin has the structure of formula (4) in which the compound having the hydroxy group and the urea moiety are linked through a crosslinkage of —OCH$_2$—. In the meanwhile, it is assumed that in the production of the resin, all hydroxy groups in the compound having hydroxy groups and all butoxymethyl groups in tetrabutoxy methyl urea are not involved in the production of the resin but a part of hydroxy groups or butoxymethyl groups remain intact. In formula (4), HO-A-OH is a compound having two hydroxy groups, and A is a part that two hydroxy groups are removed from the compound.

zotriazole compounds, azo compounds, naphthalene compounds, anthracene compounds, anthraquinone compounds, triazine compounds, triazine trione compounds, quinoline compounds or the like. Naphthalene compounds, anthracene compounds, triazine compounds and triazine trione compounds are preferably used.

As such a light absorbing compound, naphthalene compound having at least one hydroxy group, amino group or carboxy group in the molecule, and anthracene compound having at least one hydroxy group, amino group or carboxy group in the molecule are preferably used.

The naphthalene compound having at least one hydroxy group, amino group or carboxy group in the molecule includes 1-naphthalene carboxylic acid, 2-naphthalene carboxylic acid, 1-naphthol, 2-naphthol, 1-aminonaphthalene, naphthyl acetic acid, 1-hydroxy-2-naphthalene carboxylic acid, 3-hydroxy-2-naphthalene carboxylic acid, 3,7-dihy- Formula (4)

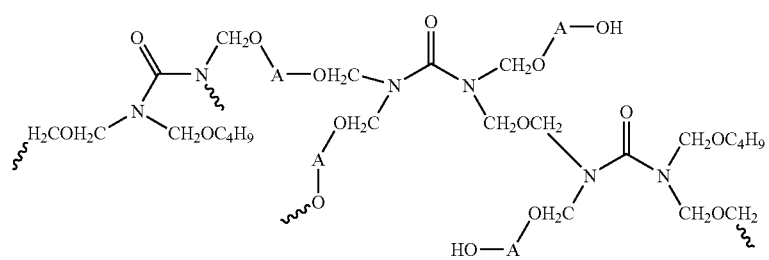

droxy-2-naphthalene carboxylic acid, 6-bromo-2-hydroxynaphthalene, 2,6-naphthalene dicarboxylic acid or the like.

The anthracene compound having at least one hydroxy group, amino group or carboxy group in the molecule includes 9-anthracene carboxylic acid, 9-hydroxymethylanthracene, 1-aminoanthracene or the like.

Further, as the light absorbing compound, triazine compound or triazine trione compound can be used.

The triazine compound includes for example melamine containing at least one methoxymethyl group or benzoguanamine compounds, concretely for example hexamethoxy methyl melamine and tetramethoxy methyl benzoguanamine.

The triazine trione compound includes compounds of formula (5)

In addition, the composition for forming anti-reflective coating according to the present invention may contain a combination of the compound of formula (1) with the resin that can be produced from the compound of formula (1). The composition for forming anti-reflective coating may contain such a combination in an amount of preferably 10 mass % or more, more preferably 50 to 99 mass %, most preferably 60 to 95 mass % based on 100 mass % of the total solid content.

Light absorbing compounds or light absorbing resins can be added to the composition for forming anti-reflective coating according to the present invention. The addition of the light absorbing compounds or light absorbing resins enables the adjustment of characteristics such as refractive index, attenuation coefficient, etching rate or the like of the anti-reflective coating formed from the composition for forming anti-reflective coating according to the present invention. These light absorbing compounds or light absorbing resins include ones having a high absorptivity to a light in photosensitive characteristics wavelength region of the photosensitive component in the photoresist layer formed on the anti-reflective coating and preventing standing wave due to reflection from the substrate or random reflection due to unevenness on the surface of substrate. Further, the light absorbing resin used has a weight average molecular weight of preferably 500 to 1,000,000, more preferably 500 to 500,000.

The light absorbing compound or light absorbing resin can be used alone or in a mixture of two or more. The amount of the light absorbing compound or light absorbing resin in the composition for forming anti-reflective coating according to the present invention is preferably 0.01 mass % or more, more preferably 1 to 90 mass %, further preferably 1 to 50 mass %, most preferably 5 to 40 mass % based on 100 mass % of the total solid content.

As the light absorbing compound, for example the following compounds can be used: benzophenone compounds, ben-

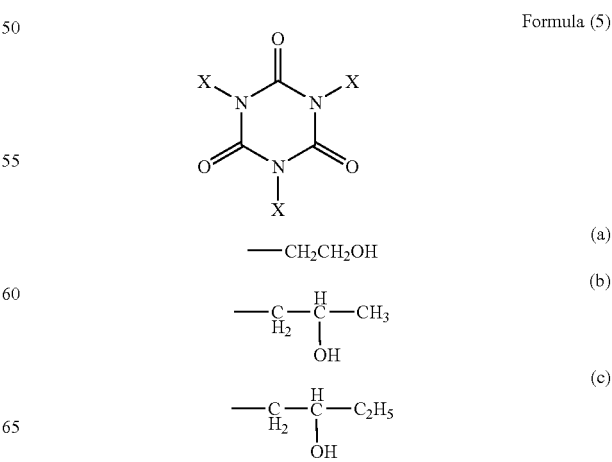

-continued

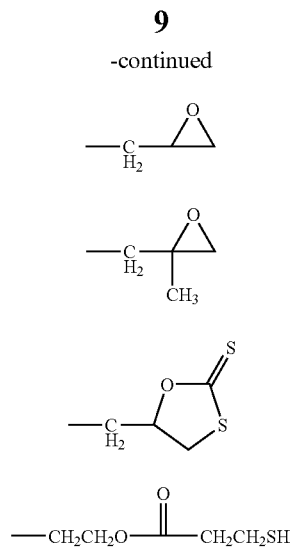

wherein X is a group of (a) to (g).

As the light absorbing resin, for example the resins having in the structure an aromatic ring structure such as benzene ring, naphthalene ring or anthracene ring, or a hetero aromatic ring structure such as pyridine ring, quinoline ring, thiophene ring, thiazole ring, triazine ring or oxazole ring can be used.

As such a light absorbing resin, the resins having at least one aromatic ring structure selected from benzene ring, naphthalene ring and anthracene ring in the repeated structural unit can be used.

The resins having a benzene ring include novolak resins, halogenated novolak resins, polystyrene, polyhydroxy styrene or the like. In addition, resins containing benzyl acrylate, benzyl methacrylate, styrene, hydroxystyrene or the like as a structural unit may be mentioned. Such a resin includes a copolymer of benzyl methacrylate with 2-hydroxypropyl methacrylate, a copolymer of styrene with 2-hydroxyethyl methacrylate, a copolymer of hydroxystyrene with ethyl methacrylate, a terpolymer of benzyl methacrylate, 2-hydroxypropyl methacrylate and ethyl methacrylate, a terpolymer of styrene, 2-hydroxyethyl methacrylate and methyl methacrylate, or the like.

Further, the resin having a benzene ring includes a resin produced from a melamine compound (trade name: Cymel 303) and benzoguanamine compound (trade name: Cymel 1123), which is described in U.S. Pat. No. 6,323,310.

The resin having a naphthalene ring or an anthracene ring includes for example resins having the following structural units ([1] to [7]):

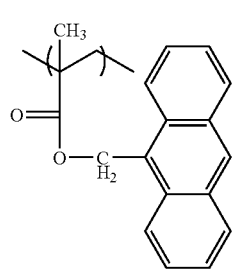

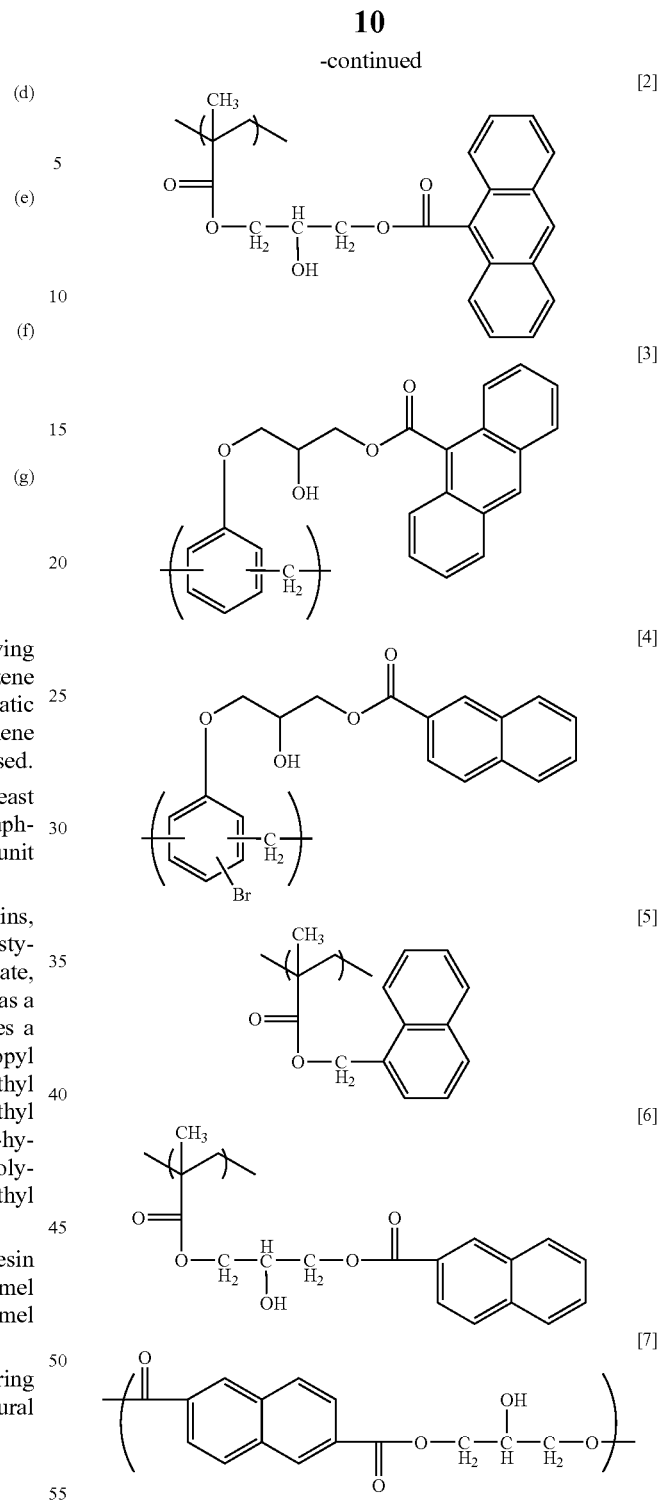

The composition for forming anti-reflective coating according to the present invention can further contain a resin having at lease one crosslink-forming substituent selected from hydroxy group, carboxy group, amino group and thiol group. The addition of such a resin enables the adjustment of characteristics such as refractive index, attenuation coefficient, etching rate or the like of the anti-reflective coating formed from the composition for forming anti-reflective coating according to the present invention. The resin can include one containing as a structural unit 2-hydroxyethylacrylate, 2-hydroxypropylacrylate, 2-hydroxyethylmethacrylate, 2-hydroxypropylmethacrylate, vinyl alcohol, 2-hydroxyethyl vinyl ether, acrylic acid, methacrylic acid or the like. The resin has a weight average molecular weight of preferably 500 to 1,000,000, more preferably 500 to 500,000. The amount of the resin in the composition for forming anti-reflective coating is preferably 20 mass % or less, more preferably 15 mass % or less based on 100 mass % of the total solid content.

The resin includes for example poly 2-hydroxyethyl methacrylate, polyvinyl alcohol, polyacrylic acid, a copolymer of 2-hydroxypropyl acrylate with methyl methacrylate, a copolymer of 2-hydroxypropyl acrylate with isopropyl methacrylate, a copolymer of 2-hydroxypropyl methacrylate with 2,2,2-trichloroethyl methacrylate, a copolymer of 2-hydroxypropyl methacrylate with 2,2,2-trifluoroethyl methacrylate, a copolymer of 2-hydroxypropyl methacrylate with 2-chloroethyl methacrylate, a copolymer of 2-hydroxypropyl methacrylate with cyclohexyl methacrylate, a copolymer of 2-hydroxypropyl methacrylate with n-octyl methacrylate, a copolymer of 2-hydroxypropyl methacrylate with vinyl alcohol, a copolymer of 2-hydroxypropyl methacrylate with acrylic acid, a copolymer of 2-hydroxypropyl methacrylate with maleimide, a copolymer of 2-hydroxypropyl methacrylate with acrylonitrile, a copolymer of vinyl alcohol with methyl methacrylate, a copolymer of vinyl alcohol with methyl methacrylate, a copolymer of vinyl alcohol with maleimide, a copolymer of 2-hydroxyethyl vinyl ether with ethyl methacrylate, a copolymer of 2-hydroxyethyl vinyl ether with 2-hydroxypropyl methacrylate, a copolymer of methacrylic acid with ethyl methacrylate, a copolymer of methacrylic acid with maleimide, or the like.

The composition for forming anti-reflective coating according to the present invention may contain an acid and/or acid generator. The acid or acid generator includes an acid compound such as acetic acid, methane sulfonic acid, trifluoroacetic acid, trifluoromethane sulfonic acid, benzoic acid, toluene sulfonic acid, pyridinium-p-toluene sulfonate, or the like; a thermal acid generator such as 2,4,6-tetrabromocyclohexadienone, benzointosylate, 2-nitrobenzyltosylate, other organic alkyl sulfonate, or the like; a photoacid generator such as bis(4-t-butylpheny)iodonium trifluoromethanesulfonate, triphenylsulfonium trifluoromethanesulfonate, phenyl-bis(trichloromethyl)-s-triazine, benzoin tosylate, N-hydroxysuccinimide trifluoromethanesulfonate, or the like. The above-mentioned acid or acid generator may be used alone or in a mixture of two or more. The acid or acid generator is may be used alone or in a mixture of two or more. The acid or acid generator is added in an amount of preferably 0.001 to 20 mass %, more preferably 0.01 to 10 mass % based on 100 mass % of the total solid content.

The anti-reflective coating forming composition according to the present invention may contain further other additives, for example rheology controlling agents, adhesion auxiliaries, surfactants, etc. in addition to the above described components, if necessary.

The rheology controlling agents are added mainly aiming at increasing the flowability of the anti-reflective coating forming composition and in particular in the heating (baking) step, increasing filling property of the anti-reflective coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyidecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 mass % based on 100 mass % of the total composition.

The adhesion auxiliaries are added mainly for the purpose of increasing the adhesion between the substrate or photoresist and the anti-reflective coating prepared from the anti-reflective coating forming composition, in particular preventing the detachment of the photoresist in development. Specific examples thereof include chlorosilanes such as trimethylchlorosilane, dimethylvinylchlorosilane, methyldiphenylchlorosilane or chloromethyldimethyl-chlorosilane; alkoxysilanes such as trimethylmethoxysilane, dimethyldiethoxysilane, methyldimethoxysilane, dimethylvinylethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxy-silane or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 5 mass %, preferably less than 2 mass %, based on 100 mass % of the total composition of the anti-reflective coating for lithography.

The anti-reflective coating forming composition according to the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 0.2 mass % or less, preferably 0.1 mass % or less, based on 100 mass % of the total composition of the anti-reflective coating for lithography according to the present invention. The surfactants may be added singly or two or more of them may be added in combination.

It is preferable that the composition for forming anti-reflective coating according to the present invention is used by dissolving each component thereof in a suitable solvent. Such a solvent includes ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, etc. The organic solvents may be used singly or in combination of two or more of them.

Further, high boiling solvents such as propylene glycol monobutyl ether or propylene glycol monobutyl ether acetate may be mixed. Among the solvents, propylene glycol monomethyl ether, propylene glycol monomethyl ether acetate, ethyl lactate, butyl lactate and cyclohexanone are preferred for increasing the leveling property.

As photoresist to be coated as an upper layer of the anti-reflective coating in the present invention, any of negative type and positive type photoresists may be used. Concrete examples of the photoresist are for example a positive type photoresist consisting of a novolak resin and 1,2-naphtoquinone diazido sulfonate, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the resist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. The photoresist includes for example trade name: APEX-E manufactured by Shipley Company, trade name: PAR710 manufactured by Sumitomo Chemical Co., Ltd., or the like.

As developer for a positive type photoresist having the anti-reflective coating formed by using the anti-reflective coating forming composition of the present invention, use may be made of aqueous solutions of alkalis, e.g., inorganic alkalis such as sodium hydroxide, potassium hydroxide, sodium carbonate, sodium silicate, sodium metasilicate or aqueous ammonia, primary amines such as ethylamine or n-propylamine, secondary amines such as diethylamine or di-n-butylamine, tertiary amines such as triethylamine or methyldiethylamine, alcohol amines such as dimethylethanolamine or triethanolamine, quaternary ammonium salts such as tetramethylammonium hydroxide, tetraethylammonium hydroxide or choline, cyclic amines such as pyrrole or piperidine, etc. Furthermore, a suitable amount of alcohols such as isopropyl alcohol or surfactants such as nonionic surfactant can be added to the aqueous solution of above-described alkalis. Among these, a preferred developer includes quaternary ammonium salts, more preferably tetramethylammonium hydroxide and choline.

Now, the method for forming photoresist patterns will be described. On a substrate for use in the production of precision integrated circuit element (for example silicon/silicon dioxide coat substrate, glass substrate, ITO substrate or the like), an anti-reflective coating forming composition is coated by a suitable coating method, for example, with a spinner, a coater or the like, and thereafter the substrate is baked to cure the composition to fabricate an anti-reflective coating. The film thickness of the anti-reflective coating is preferably 0.01 to 3.0 μm. The conditions of baking after the coating are 80 to 250° C. for 1 to 120 minutes. Then, a photoresist is coated, it is exposed to light through a predetermined mask, developed, rinsed and dried to obtain a good photoresist pattern. If necessary, post exposure bake (PEB) may be performed. In addition, it is able to form a desired pattern on the substrate by removing by dry etching a part of the anti-reflective coating which a photoresist was removed by development in the previous step.

The anti-reflective coating produced from the composition for forming anti-reflective coating according to the present invention can be used in a thinner film than the prior ones, and time required for etching process of the anti-reflective coating can be greatly reduced. Further, the anti-reflective coating has a characteristic that it has a high dry etching rate compared with the photoresist.

The anti-reflective coating formed from the composition for forming anti-reflective coating according to the present invention can be used by selecting process condition as a coating having the following functions: a function of preventing reflection light, a function of preventing a mutual interaction between a substrate and a photoresist, or a function of preventing an adverse effect to a substrate by a material used in the photoresist or a substance generated on exposure to the photoresist.

Hereinafter, the present invention will be further concretely described based on synthesis examples, examples, comparative examples, test examples and measurement examples but the present invention is not limited thereto.

SYNTHESIS EXAMPLE 1

After 15 g of 2,2,2-trifluoroethyl methacrylate and 15 g of 2-hydroxyethyl methacrylate were dissolved in 120 g of ethyl lactate, the resulting reaction solution was warmed to 70° C., and at the same time nitrogen gas was passed into the reaction solution. Thereafter, 0.6 g of azobisisobutyronitrile was added as a polymerization initiator. The resulting solution was stirred under nitrogen atmosphere for 24 hours and 0.01 g of 4-methoxyphenol was added as a short stopping agent. Then, the reaction solution was poured into diethyl ether to obtain a resin compound of formula (6) as a precipitate. The resulting resin compound was subjected to GPC analysis and had a weight average molecular weight of 20,200 in terms of standard polystyrene. In formula (6), n and m are molar ratio of the structural unit monomers, and n+m=1.

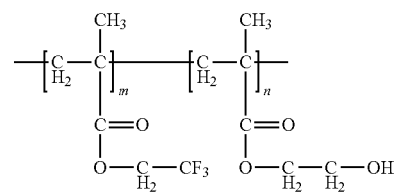

Formula (6)

SYNTHESIS EXAMPLE 2

After 15 g of 2,2,2-trichloroethyl methacrylate and 15 g of 2-hydroxyethyl methacrylate were dissolved in 120 g of ethyl lactate, the resulting reaction solution was warmed to 55° C., and at the same time nitrogen gas was passed into the reaction solution. Thereafter, 0.6 g of 2,2-azo(4-methoxy-2,4-dimethylvaleronitrile (trade name: V-70 manufactured by Wako Pure Chemical Industries, Inc.) was added as a polymerization initiator. The resulting solution was stirred under nitrogen atmosphere for 24 hours and 0.01 g of 4-methoxyphenol was added as a short stopping agent. Then, the reaction solution was poured into diethyl ether to obtain a resin compound of formula (7) as a precipitate. The resulting resin compound was subjected to GPC analysis and had a weight average molecular weight of 16,100 in terms of standard polystyrene. In formula (7), n and m are molar ratio of the structural unit monomers, and n+m=1.

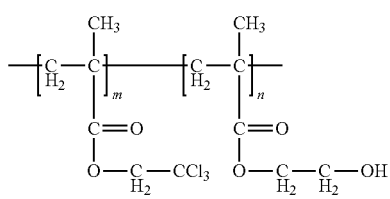

Formula (7)

SYNTHESIS EXAMPLE 3

To 80 g of propylene glycol monomethyl ether, 10 g of cresol novolak resin (trade name: ECN1299 manufactured by Asahi Chiba Co., Ltd., weight average molecular weight: 3,900) was added and dissolved therein. After 9.7 g of 9-anthracene carboxylic acid and 0.26 g of benzyl triethyl ammonium chloride were added to the resulting solution, the reaction solution was subjected to reaction at 105° C. for 24 hours to obtain a resin compound of formula (8). The resulting resin compound was subjected to GPC analysis and had a weight average molecular weight of 5,600 in terms of standard polystyrene.

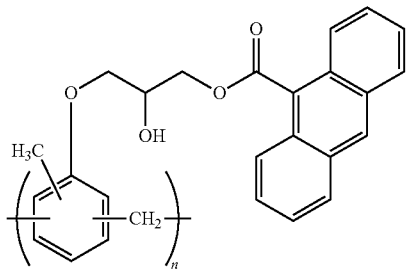

Formula (8)

SYNTHESIS EXAMPLE 4

After 21 g of glycidyl methacrylate and 39 g of 2-hydroxypropyl methacrylate were dissolved in 242 g of propylene glycol monomethyl ether, the resulting reaction solution was warmed to 70° C. Thereafter, 0.6 g of azobisisobutyronitrile was added while the temperature was kept at 70° C. The resulting solution was subjected to reaction at 70° C. for 24 hours to obtain a solution of a copolymer of glycidyl methacrylate with 2-hydroxypropyl methacrylate. To 100 g of the solution, 10 g of 9-anthracene carboxylic acid and 0.3 g of benzyl triethyl ammonium chloride were added, the reaction solution was subjected to reaction at 130° C. for 24 hours to obtain a solution of a resin compound of formula (9). In formula (9), n and m are molar ratio of the structural unit monomers, and n+m=1.

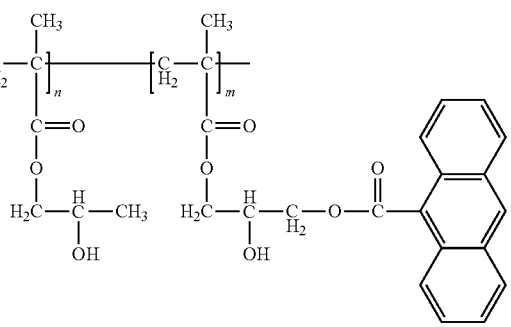

Formula (9)

EXAMPLE 1

After 3.6 g of tetramethoxymethylurea oligomer composition (degree of polymerization: 2.5) UFR65 (a product manufactured by Mitsui Cytec Co., Ltd.) and 0.11 g of p-toluene sulfonic acid were mixed and 43 g of ethyl lactate was added thereto, the resulting solution was filtered through a micro filter made of polyethylene having a pore diameter of 0.10 μm, and then filtered through a micro filter made of polyethylene having a pore diameter of 0.05 μm, to prepare a composition solution for forming anti-reflective coating.

EXAMPLE 2

After 7.0 g of tetrabutoxymethylurea oligomer composition (degree of polymerization: 5) UFR300 (60% solution in xylene/butanol) (a product manufactured by Mitsui Cytec Co., Ltd.) and 0.12 g of p-toluene sulfonic acid were mixed and 46 g of ethyl lactate was added thereto, the resulting solution was filtered through a micro filter made of polyethylene having a pore diameter of 0.10 μm, and then filtered through a micro filter made of polyethylene having a pore diameter of 0.05 μm, to prepare a composition solution for forming anti-reflective coating.

EXAMPLE 3

After 18.42 g of tetrabutoxymethylurea oligomer composition (degree of polymerization: 5) UFR300 (60% solution in xylene/butanol) (a product manufactured by Mitsui Cytec Co., Ltd.), 1.22 g of 2,2,2-trifluoroethyl methacrylate/2-hydroxyethyl methacrylate copolymer resin obtained in Synthesis Example 1 and 0.33 g of p-toluene sulfonic acid were mixed and 186.9 g of ethyl lactate was added thereto, the resulting solution was filtered through a micro filter made of polyethylene having a pore diameter of 0.10 μm, and then filtered through a micro filter made of polyethylene having a pore diameter of 0.05 μm, to prepare a composition solution for forming anti-reflective coating.

EXAMPLE 4

After 18.05 g of tetrabutoxymethylurea oligomer composition (degree of polymerization: 5) UFR300 (60% solution in xylene/butanol) (a product manufactured by Mitsui Cytec Co., Ltd.), 1.22 g of 2,2,2-trichloroethyl methacrylate/2-hydroxyethyl methacrylate copolymer resin obtained in Synthesis Example 2 and 0.33 g of p-toluene sulfonic acid were mixed and 186.9 g of ethyl lactate was added thereto, the resulting solution was filtered through a micro filter made of polyethylene having a pore diameter of 0.10 µm, and then filtered through a micro filter made of polyethylene having a pore diameter of 0.05 µm, to prepare a composition solution for forming anti-reflective coating.

EXAMPLE 5

After 15.80 g of tetrabutoxymethylurea oligomer composition (degree of polymerization: 5) UFR300 (60% solution in xylene/butanol) (a product manufactured by Mitsui Cytec Co., Ltd.), 2.37 g of polyhydroxy styrene resin (a product manufactured by Aldrich Co.) and 0.36 g of p-toluene sulfonic acid were mixed and 185.7 g of ethyl lactate was added thereto, the resulting solution was filtered through a micro filter made of polyethylene having a pore diameter of 0.10 µm, and then filtered through a micro filter made of polyethylene having a pore diameter of 0.05 µm, to prepare a composition solution for forming anti-reflective coating.

EXAMPLE 6

After 15.17 g of tetrabutoxymethylurea oligomer composition (degree of polymerization: 5) UFR300 (60% solution in xylene/butanol) (a product manufactured by Mitsui Cytec Co., Ltd.), 1.86 g of phenol novolak resin PSM4327 (a product manufactured by Gunei Chemical Industry Co., Ltd.) and 0.33 g of p-toluene sulfonic acid were mixed and 145.2 g of ethyl lactate was added thereto, the resulting solution was filtered through a micro filter made of polyethylene having a pore diameter of 0.10 µm, and then filtered through a micro filter made of polyethylene having a pore diameter of 0.05 µm, to prepare a composition solution for forming anti-reflective coating.

EXAMPLE 7

To 10 g of tetrabutoxymethylurea oligomer composition (degree of polymerization: 5) UFR300 (60% solution in xylene/butanol) (a product manufactured by Mitsui Cytec Co., Ltd.), 0.4 g of pyridinium-p-toluene sulfonate and 2.6 g of 9-hydroxymethyl anthracene were mixed, and 94 g of ethyl lactate and 42 g of propylene glycol monomethyl ether acetate were dissolved therein to obtain a solution. Then, the resulting solution was filtered through a micro filter made of polyethylene having a pore diameter of 0.10 µm, and then filtered through a micro filter made of polyethylene having a pore diameter of 0.05 µm, to prepare a composition solution for forming anti-reflective coating.

EXAMPLE 8

To 10 g of tetrabutoxymethylurea oligomer composition (degree of polymerization: 5) UFR300 (60% solution in xylene/butanol) (a product manufactured by Mitsui Cytec Co., Ltd.), 0.4 g of pyridinium-p-toluene sulfonate and 3.6 g of 3,7-dihydroxy-2-naphthalene carboxylic acid were mixed, and 106 g of ethyl lactate and 47 g of propylene glycol monomethyl ether acetate were dissolved therein to obtain a solution. Then, the resulting solution was filtered through a micro filter made of polyethylene having a pore diameter of 0.10 µm, and then filtered through a micro filter made of polyethylene having a pore diameter of 0.05 µm, to prepare a composition solution for forming anti-reflective coating.

EXAMPLE 9

To 2.5 g of tetrabutoxymethylurea oligomer composition (degree of polymerization: 5) UFR300 (60% solution in xylene/butanol) (a product manufactured by Mitsui Cytec Co., Ltd.), 0.05 g of pyridinium-p-toluene sulfonate and 56.7 g of propylene glycol monomethyl ether were added, and then the resulting solution was filtered through a micro filter made of polyethylene having a pore diameter of 0.10 µm, and then filtered through a micro filter made of polyethylene having a pore diameter of 0.05 µm, to prepare a composition solution for forming anti-reflective coating.

COMPARATIVE EXAMPLE 1

To 10 g of a solution containing 2 g of the resin compound obtained in Synthesis Example 3, 0.53 g of hexamethoxymethylmelamine and 0.05 g of p-toluene sulfonic acid monohydrate were mixed, and the resulting solution was dissolved in 14.3 g of ethyl lactate, 1.13 g of propylene glycol monomethyl ether and 2.61 g of cyclohexanone to obtain 9% solution. Then, the solution was filtered through a micro filter made of polyethylene having a pore diameter of 0.10 µm, and then, the solution was filtered through a micro filter made of polyethylene having a pore diameter of 0.05 µm, to prepare a composition solution for forming anti-reflective coating.

COMPARATIVE EXAMPLE 2

To 10 g of a solution containing 2 g of the resin compound obtained in Synthesis Example 4, 0.5 g of tetramethoxymethyl glycoluril and 0.03 g of p-toluene sulfonic acid were mixed, and the resulting solution was dissolved in 37.3 g of propylene glycol monomethyl ether and 19.4 g of cyclohexanone to obtain a solution. Then, the solution was filtered through a micro filter made of polyethylene having a pore diameter of 0.10 µm, and then, the solution was filtered through a micro filter made of polyethylene having a pore diameter of 0.05 µm, to prepare a composition solution for forming anti-reflective coating.

Dissolution Test in Solvent for Photoresist

The composition solutions for forming anti-reflective coating obtained in Examples 1 to 9 and Comparative Examples 1 and 2 were coated on silicon wafers by means of a spinner. The coated silicon wafers were baked at 205° C. for 1 minute on a hot plate to form anti-reflective coatings (film thickness 0.23 µm in Examples 1 to 6 and Comparative Example 1, film thickness 0.10 µm in Examples 7 and 8 and Comparative Example 2). The anti-reflective coatings were dipped in a solvent used for photoresists, such as ethyl lactate and propylene glycol monomethyl ether and as a result it was confirmed that the resulting coatings were insoluble in these solvents.

Test of Intermixing with Photoresist

The composition solutions for forming anti-reflective coating obtained in Examples 1 to 6 and Comparative Example 1 were coated on silicon wafers by means of a spinner. The coated silicon wafers were baked at 205° C. for 1 minute on a hot plate to form anti-reflective coatings (film thickness 0.23 µm). On each anti-reflective coating was coated a commercially available photoresist solution (manufactured by Sumitomo Chemical Co., Ltd.; trade name: PAR710) by means of a spinner. The coated wafers were heated at 90° C. for 1 minute on a hot plate. After exposure of the resists to light, post exposure bake was performed at 90° C. for 1.5 minute. After developing the photoresists, the film thickness of the anti-reflective coatings was measured and no change was confirmed in the film thickness. Thus it was confirmed that no intermixing occurred between the anti-reflective coatings obtained from anti-reflective coating solutions prepared in Examples 1 to 6 and Comparative Example 1 and the photoresist layers.

The composition solutions for forming anti-reflective coating obtained in Examples 7 and 8 and Comparative Example 2 were coated on silicon wafers by means of a spinner. The coated silicon wafers were baked at 205° C. for 1 minute on a hot plate to form anti-reflective coatings (film thickness 0.10 µm). On each anti-reflective coating was coated a commercially available photoresist solution (manufactured by Shipley Company; trade name: UV113) by means of a spinner. The coated wafers were heated at 120° C. for 1 minute on a hot plate. After exposure of the resists to light, post exposure bake was performed at 115° C. for 1 minute. After developing the photoresists, the film thickness of the anti-reflective coatings was measured and no change was confirmed in the film thickness. Thus it was confirmed that no intermixing occurred between the anti-reflective coatings obtained from anti-reflective coating solutions prepared in Examples 7 and 8 and Comparative Example 2 and the photoresist layers.

Measurement of Optical Parameter

The composition solutions for forming anti-reflective coating obtained in Examples 1 to 6 and Comparative Example 1 were coated on silicon wafers by means of a spinner. The coated silicon wafers were baked at 205° C. for 1 minute on a hot plate to form anti-reflective coatings (film thickness 0.08 µm). On each anti-reflective coating, refractive index (n) and attenuation coefficient (k) at a wavelength of 193 nm were measured with a spectroscopic ellipsometer. The results of the measurement are shown in Table 1 below.

The composition solutions for forming anti-reflective coating obtained in Examples 7 and 8 and Comparative Example 2 were coated on silicon wafers by means of a spinner. The coated silicon wafers were baked at 225° C. for 1 minute on a hot plate to form anti-reflective coatings (film thickness 0.06 µm). On each anti-reflective coating, refractive index (n) and attenuation coefficient (k) at a wavelength of 248 nm were measured with a spectroscopic ellipsometer. The results of the measurement are shown in Table 2 below.

The composition solution for forming anti-reflective coating obtained in Example 9 was coated on silicon wafers by means of a spinner. The coated silicon wafer was baked at 205° C. for 1 minute on a hot plate to form an anti-reflective coating (film thickness 0.06 µm). On the anti-reflective coating, refractive index (n) and attenuation coefficient (k) at a wavelength of 157 nm were measured with a spectroscopic ellipsometer (manufactured by J. A. Woollam Co., VUV-VASE VU-302). The results of the measurement are shown in Table 3 below.

Measurement of Dry Etching Rate

The composition solutions for forming anti-reflective coating obtained in Examples 1 to 9 and Comparative Examples 1 and 2 were coated on silicon wafers by means of a spinner. The coated silicon wafers were baked at 205° C. for 1 minute on a hot plate to form anti-reflective coatings. Then, dry etching rate on each anti-reflective coating was measured with RIE system ES401 manufactured by Nippon Scientific Co., Ltd. under the condition in which $CF_4$ was used as dry etching gas.

Similarly, a photoresist solution (trade name: PAR710 manufactured by Sumitomo Chemical Co., Ltd. and trade name: UV113 manufactured by Shipley Company) was coated on silicon wafers by means of a spinner. Then, dry etching rate on each photoresist was measured with RIE system ES401 manufactured by Nippon Scientific Co., Ltd. under the condition in which $CF_4$ was used as dry etching gas.

The dry etching rate on the anti-reflective coatings in Examples 1 to 6 and 9 and Comparative Example 1 was compared with that on the photoresist (trade name: PAR710) manufactured by Sumitomo Chemical Co., Ltd. The results of the measurement are shown in Table 1 or 3 below.

The dry etching rate on the anti-reflective coatings in Examples 7 and 8 and Comparative Example 2 was compared with that on the photoresist (trade name: UV113) manufactured by Shipley Company. The results of the measurement are shown in Table 2 below.

Simulation of the First Minimum Film Thickness

The first minimum film thickness and the reflection rate in case where an anti-reflective coating was used in the first minimum film thickness were determined by simulation calculation with the refractive index (n) and the attenuation coefficient (k) at a wavelength of 248 nm of the anti-reflective coatings for lithography prepared from the composition solutions for forming anti-reflective coating obtained in Examples 7 and 8 and Comparative Example 2. In this case, for the simulation PROLITH/2 manufactured by FINLE Technologies Inc. was used. The results are shown in Table 2 below.

TABLE 1

|  | Refractive Index (n) | Attenuation coefficient (k) | Dry etching rate selection ratio to photoresist |
|---|---|---|---|
| Example 1 | 1.83 | 0.34 | 2.74 |
| Example 2 | 1.86 | 0.40 | 2.46 |
| Example 3 | 1.86 | 0.29 | — |
| Example 4 | 1.89 | 0.30 | — |
| Example 5 | 1.78 | 0.58 | 1.52 |
| Example 6 | 1.75 | 0.54 | 1.54 |
| Comparative Example 1 | 1.60 | 0.47 | 0.88 |

TABLE 2

|  | Refractive index (n) | Attenuation coefficient (k) | First minimum film thickness (nm) | Reflection rate (%) | Selection ratio* |
|---|---|---|---|---|---|
| Example 7 | 1.54 | 0.43 | 57 | <0.01 | 1.4 |
| Example 8 | 1.83 | 0.56 | 39 | <0.01 | 1.5 |
| Comparative Example 2 | 1.48 | 0.47 | 59 | 0.20 | 1.3 |

*"Section ratio" means dry etching rate selection ratio to photoresist.

TABLE 3

|  | Refractive Index (n) | Attenuation coefficient (k) | Dry etching rate selection ratio to photoresist |
|---|---|---|---|
| Example 9 | 1.52 | 0.32 | 2.46 |

From the results indicated in Tables 1 to 3, it is understood that the anti-reflective coatings for lithography prepared from the composition for forming anti-reflective coating according to the present invention have a satisfactorily effective refractive index and attenuation coefficient for a light of a wavelength of 193 nm (Examples 1 to 6), a wavelength of 248 nm (Examples 7 and 8) and a wavelength of 157 nm (Example 9). In addition, it is understood that they have a high selection ratio of dry etching rate to photoresist being used in condition of a wavelength of 248 nm or 193 nm (Examples 1 to 9). Further, it is understood that they exerts a high protection effect against light reflection compared with the prior antireflective coating, and that they can be used in thinner film (Examples 7 and 8). Consequently, it is concluded that the composition for forming anti-reflective coating according to the present invention can provide an excellent bottom organic anti-reflective coating.

INDUSTRIAL APPLICABILITY

The present invention can provide a composition for forming anti-reflective coating for affording an excellent anti-reflective coating that has a good absorption of light at a wavelength utilized for manufacturing a semiconductor device, that exerts a high protection effect against light reflection, that has a high dry etching rate compared with the photoresist layer, that causes no intermixing with the photoresist layer, and that occurs no diffusion to the photoresist upon heating and drying.

The invention claimed is:

1. A process for manufacturing a semiconductor device, characterized by comprising the steps of:
    coating an anti-reflective coating forming composition on a substrate and baking it to form an anti-reflective coating;
    wherein the anti-reflective coating forming composition comprises a resin produced by a condensation reaction between compounds of formula (1),

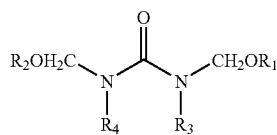

Formula (1)

wherein $R_1$ and $R_2$ are independently of each other hydrogen atom or an alkyl group, $R_3$ and $R_4$ are independently of each other hydrogen atom, methyl group, ethyl group, hydroxymethyl group or an alkoxymethyl group, and an acid and/or acid generator,
    the resin produced from the condensation reaction between compounds of formula (1) has a weight average molecular weight of 200 to 500,000, and
    the resin produced from compounds of formula (1) is contained in an amount of more than 50 mass % in a solid content of the anti-reflective coating forming composition;
    forming a photoresist on top of the anti-reflective coating;
    exposing the substrate covered with the anti-reflective coating and the photoresist with a light;
    developing it;
    transferring an image on the substrate by etching to form an integrated circuit device.

2. The process for manufacturing a semiconductor device according to claim 1, wherein the anti-reflective coating forming composition further comprises a light absorbing compound and/or a light absorbing resin.

3. The process for manufacturing a semiconductor device according to claim 2, wherein the light-absorbing compound is at least one compound selected from naphthalene compounds and anthracene compounds.

4. The process for manufacturing a semiconductor device according to claim 2, wherein the light absorbing compound is at least one compound selected from triazine compounds and triazine trione compounds.

5. The process for manufacturing a semiconductor device according to claim 2, wherein the light absorbing resin is a resin having in the structure at least one aromatic ring structure selected from benzene ring, naphthalene ring and anthracene ring.

6. The process for manufacturing a semiconductor device according to claim 1, wherein the anti-reflective coating forming composition further comprises a resin having at least one crosslink-forming substituent selected from hydroxy group, carboxy group, amino group and thiol group.

7. The process for manufacturing a semiconductor device according to claim 1, wherein the resin produced from the condensation reaction between compounds of formula (1) have urea moieties linked through —$CH_2$— or —$CH_2OCH_2$—.

8. The process for manufacturing a semiconductor device according to claim 1, wherein the resin produced from the condensation reaction between compounds of formula (1) is in an amount of 60 to 95 mass % in a solid content of the anti-reflective coating forming composition.

* * * * *